United States Patent [19]

Harasaki

[11] Patent Number: 5,563,887
[45] Date of Patent: Oct. 8, 1996

[54] TRANSMISSION ERROR CORRECTION CODE APPENDING DEVICE WHICH CAN REGULATE A MAXIMUM DELAY OF AN INTERLEAVER IN A VARIABLE BIT RATE VIDEO CODING SYSTEM

[75] Inventor: Hidenobu Harasaki, Tokyo, Japan

[73] Assignee: NEC Corporation, Japan

[21] Appl. No.: 311,924

[22] Filed: Sep. 26, 1994

[30] Foreign Application Priority Data

Sep. 28, 1993 [JP] Japan .................................. 5-240982

[51] Int. Cl.$^6$ ...................................................... H04J 3/22
[52] U.S. Cl. ......................... 370/94.1; 370/84; 371/37.5
[58] Field of Search ............................ 370/61, 18, 110.1, 370/94.1, 60, 60.1, 84, 118, 62, 94.2, 79, 82, 83, 99, 100.1, 103, 105.1, 108; 371/11.2, 37.2, 37.4, 37.5, 37.6, 37.1, 37.8, 38.1, 37.9, 39.1, 45, 56; 348/15, 387, 390, 460, 467, 461, 407, 404; 379/202; 341/61

[56] References Cited

U.S. PATENT DOCUMENTS 5,241,563  8/1993  Paik et al. .................................. 370/18

FOREIGN PATENT DOCUMENTS 63-287222  11/1988  Japan .

OTHER PUBLICATIONS

International Telecommunication Union, *Integrated Services Digital Network (ISDN), Overall Network Aspects and Functions,* "B–ISDN ATM Adaption Layer (AAL) Specification," ITU–T Recommendation 1.363, Mar., 1993.

*Primary Examiner*—Douglas W. Olms
*Assistant Examiner*—Dang Ton
*Attorney, Agent, or Firm*—Ostrolenk, Faber, Gerb & Soffen, LLP

[57] ABSTRACT

In a transmission error correction code appending device which receives a variable bit rate signal transmitted at a variable bit rate and having a plurality of information bytes, a transmitting circuit transmits, unless a timer circuit produces a time-out signal, the information bytes to a correction code appending circuit and transmits, when the timer circuit produces the time-out signal, zero bytes to the correction code appending circuit subsequently to the information bytes so that the information bytes and the zero bytes constitute first through N-th data bytes of first through M-th data groups, where each of M and N represents a predetermined plural and natural number. The correction code appending circuit consecutively supplies an interleaver with first through M-th blocks, each having the first through the N-th data bytes and first through P-th error correction code bytes as first through Q-th block bytes, where P represents a prescribed natural number, Q being equal to (N+P). An informing signal producer produces an informing signal when the interleaver receives the first block byte of the first block. The timer circuit produces the time-out signal when the timer circuit times a preselected time interval from a time instant at which the timer circuit receives the informing signal.

13 Claims, 7 Drawing Sheets

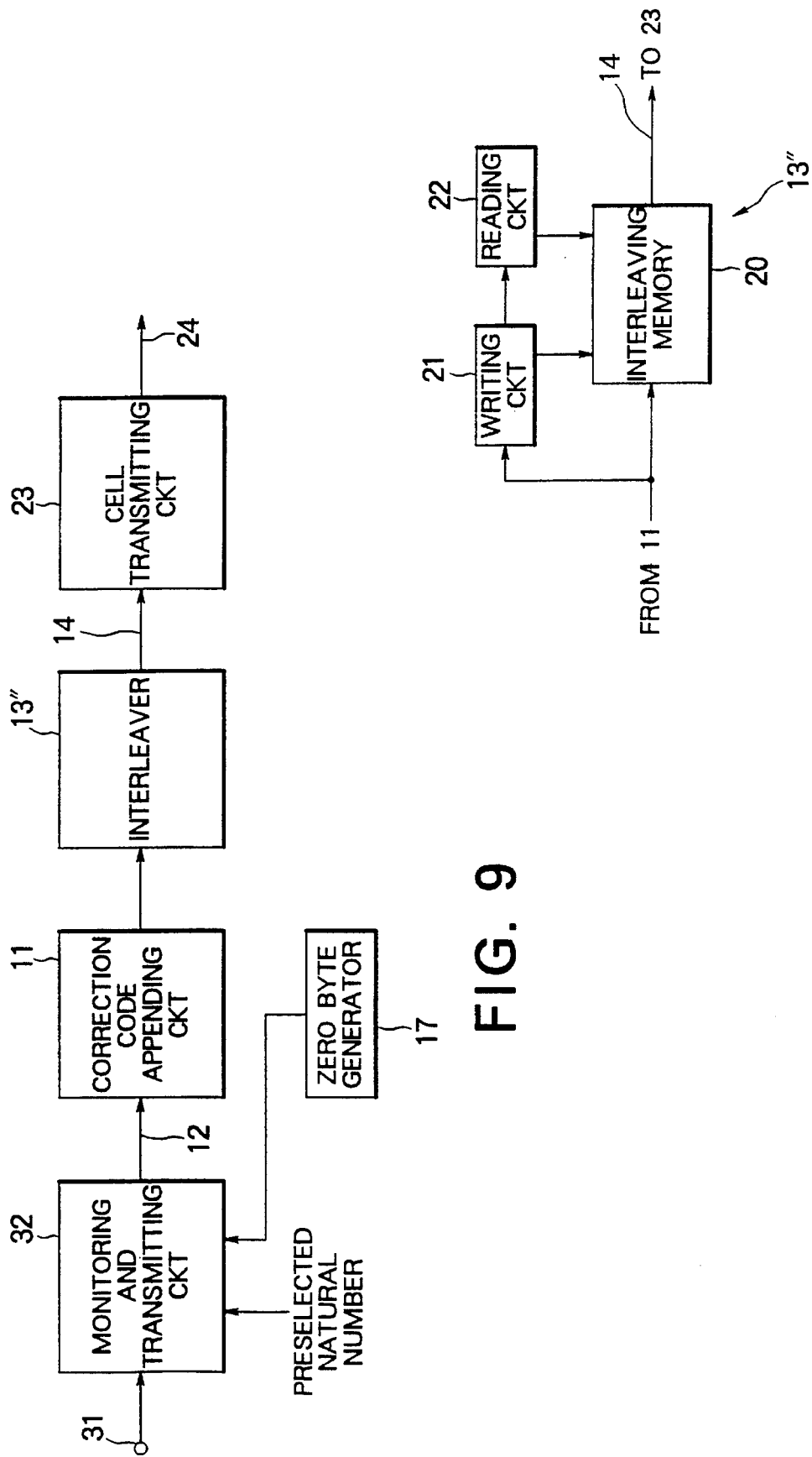

TRANSMISSION ERROR CORRECTION CODE APPENDING DEVICE WHICH CAN REGULATE A MAXIMUM DELAY OF AN INTERLEAVER IN A VARIABLE BIT RATE VIDEO CODING SYSTEM

BACKGROUND OF THE INVENTION

This invention relates to a transmission error correction code appending device which serves as a transmission error countermeasure part for use in a coding device used in carrying out digital-transmission of a motion picture through a variable bit rate line in, for example, a video conference system.

In ITU-T (Telecommunication Standardization Sector of International Telecommunication Union: previously CCITT) and related standardization organizations, a variable bit rate coding system is studied as a video transmission system of a B-ISDN (Broadband Integrated Services Digital Network) age. Inasmuch as use is made, in the B-ISDN, of an ATM (asynchronous transfer mode) transmission in which information is treated as a form of ATM cells, it is possible to realize not only conventional constant bit rate video coding but also variable bit rate video coding. However, transmission errors, such as bit errors and cell losses, inevitably occur in a transmission line. It is therefore necessary on transmission of video information to take transmission error countermeasures in coding and decoding layers and in an ATM adaptation layer (AAL) positioned between each of the coding and the decoding layers and a transmission layer.

In a paragraph 2.5.2.4.1 (Correction method for bit errors and cell losses for unidirectional services) of ITU-T Recommendation (previously CCITT Recommendation) I.363 (B-ISDN ATM ADAPTATION LAYER (ALL) SPECIFICATION), a correction method for the bit errors and the cell losses is disclosed which method uses forward error correction (FEC) and octet interleaving on transmitting the video information as the ATM cells from a transmitting side to a receiving side through the transmission line. That is, a combination of forward error correction codes and an octet interleaver of the ALL type 1 is used as a transmission error countermeasure part of the transmitting side in taking the countermeasure for the transmission errors which occur in the transmission line for transmission of the ATM cells. The octet interleaver is for use in a constant bit rate video transmission and carries out an interleaving operation known in the art.

In Japanese Unexamined Patent Publication No. 63-287222 (namely, 287222/1988) under the title of "Packet Generator", another correction method is disclosed which also uses a combination of error correction codes and an interleaving circuit in the transmitting side in taking the countermeasure for the transmission errors which occur in the transmission line for transmission of packets.

A cross interleaver used in a compact disk device carries out operation which is similar to that of the octet interleaver. The cross interleaver has a capability of correcting a burst read-out error of a head of the compact disk device.

According to the correction method using either the octet interleaver or the interleaving circuit, error resilience can be obtained in case of the constant bit rate video transmission. A maximum delay of either the octet interleaver or the interleaving circuit can be regulated or assured in case of the constant bit rate video transmission. However, the maximum delay of either the octet interleaver or the interleaving circuit can not be regulated or assured in case of a variable bit rate video transmission. This is because supply of data to either the octet interleaver or the interleaving circuit is unavoidably interrupted or stopped during an interrupted time interval in case of the variable bit rate video transmission. The interleaving operation of either the octet interleaver or the interleaving circuit is inevitably interrupted or stopped during the interrupted time interval. The interrupted time interval varies due to a predictive coding state of a coding device which carries out the variable bit rate video coding. The interrupted time interval is, for example, 1/30 seconds (namely, 33 milliseconds) when the coding device carries out a frame drop or subsampling of a digital video signal having 30 frames per second.

SUMMARY OF THE INVENTION

It is therefore an object of this invention to provide a transmission error correction code appending device which makes it possible to regulate or assure a maximum delay of an interleaving operation in case of a variable bit rate video transmission.

Other objects of this invention will become clear as the description proceeds.

On describing the gist of an aspect of this invention, it is possible to understand that a transmission error correction code appending device has a device input terminal for receiving a variable bit rate signal transmitted at a variable bit rate and comprising a plurality of information bytes. The device includes: a correction code appending circuit supplied with an incoming signal comprising first through M-th data groups, each comprising first through N-th data bytes, where M and N represent first and second predetermined plural and natural numbers, respectively, the correction code appending circuit consecutively appending to the first through the M-th data groups first through M-th error correction codes, each comprising first through P-th code types, where P represents a prescribed natural number, the correction code appending circuit consecutively producing first through M-th blocks, each comprising the first through the N-th data bytes and the first through the P-th code bytes as first through Q-th block bytes, where Q is equal to (N+P); and an interleaver connected to the correction code appending circuit for consecutively receiving the first through the Q-th block bytes of the first through the M-th blocks and for carrying out an interleaving operation on the first through the M-th blocks to successively and consecutively produce first through Q-th interleaved data units. A q-th interleaved data unit of the first through the Q-th interleaved data units comprises a q-th block byte of the first through the Q-th block bytes of each of the first through the M-th blocks, where q consecutively varies from 1 to Q.

According to the aspect of this invention, the above-understood transmission error correction code appending device comprises: informing signal producing means connected to the interleaver for producing an informing signal when the interleaver receives the first block byte of the first block; a timer circuit connected to the informing signal producing means for timing a preselected time interval from a time instant at which the timer circuit receives the informing signal, the timer circuit producing a time-out signal when the timer circuit times the preselected time interval without receiving a following informing signal which follows said informing signal; a zero byte generator for generating zero bytes, each consisting all zero bits; and a transmitting circuit connected to the device input terminal, the correction code appending circuit, the timer circuit, and the zero byte generator for transmitting, unless said timer circuit produces said time-out signal, the information bytes to the correction code appending circuit as they are and for transmitting, when the timer circuit produces the time-out signal, the zero bytes to the correction code appending circuit subsequently to the information bytes so that the information bytes and the zero bytes constitute the first through the N-th data bytes of the first through the M-th data groups of the incoming signal.

On describing the gist of a different aspect of this invention, it is possible to understand that a transmission error correction code appending device has a device input terminal for receiving a variable bit rate signal transmitted at a variable bit rate and comprising a plurality of packets, each comprising a variable number of information bytes. The device includes: a correction code appending circuit supplied with an incoming signal comprising a first predetermined plural number M of data groups, each of which is of a second predetermined plural number N of bytes, the correction code appending circuit appending to each of the data groups an error correction code of a prescribed natural number P of bytes to produce blocks, equal in number to M, each of which is of a third predetermined plural number Q of bytes, where Q is equal to (N+P); and an interleaver connected to the correction code appending circuit for receiving the blocks and for carrying out an interleaving operation on the blocks to successively produce a first preselected number of interleaved data units, each of which is of a second preselected number of bytes. The first and the second preselected numbers are equal to Q and M, respectively.

According to the different aspect of this invention, the above-understood transmission error correction code appending device comprises: a zero byte generator for generating zero bytes, each consisting all zero bits; and a monitoring and transmitting circuit connected to the device input terminal, the correction code appending circuit, and the zero byte generator and given a preselected natural number greater than one and not greater than (M×N) for monitoring the number of the information bytes of each of the packets and for transmitting, unless the number of the information bytes of each of the packets is less than the predetermined natural number, the information bytes of each of the packets to the correction code appending circuit as a part of the bytes of the data groups of the incoming signal as they are. The monitoring and transmitting circuit transmits, when the number of the information bytes of each of the packets is less than the preselected natural number, the zero bytes, equal in number to the preselected natural number minus the number of the information bytes of each of the packets, to the correction code appending circuit subsequently to the information bytes of each of the packets as another part of the bytes of the data groups of the incoming signal.

BRIEF DESCRIPTION OF THE DRAWING

FIG. 9 is a block diagram of a transmission error correction code appending device according to a third embodiment of this invention; and FIG. 10 is a block diagram of still another interleaver included in the transmission error correction code appending device illustrated in FIG. 9.

DESCRIPTION OF THE PREFERRED EMBODIMENT

Figure 1:
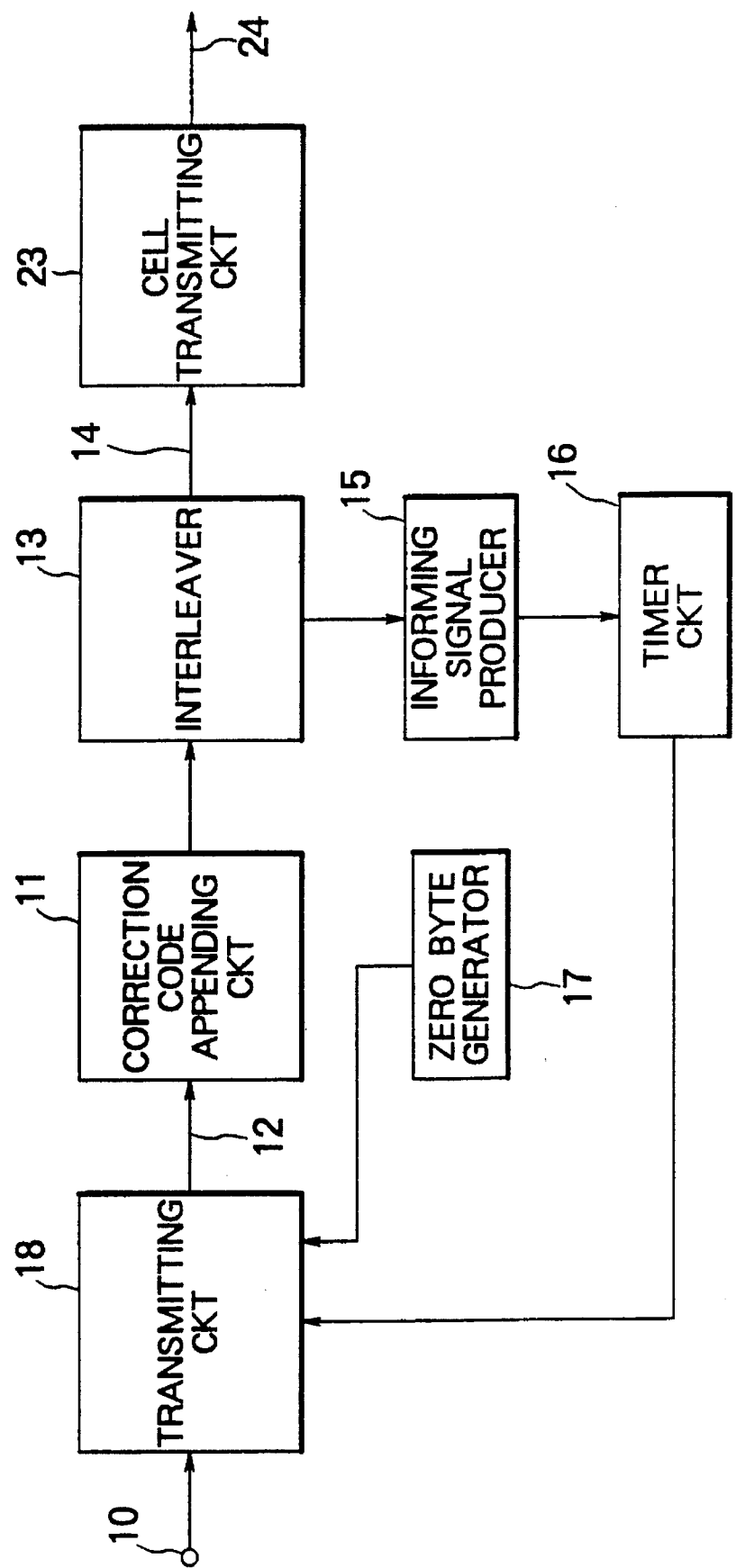
FIG. 1 is a block diagram of a transmission error correction code appending device according to a first embodiment of this invention.

Referring to FIG. 1, a transmission error correction code appending device according to a first embodiment of this invention serves as a transmission error countermeasure part for use in a coding device in a variable bit rate video coding system. That is, the transmission error correction code appending device is used as the transmission error countermeasure part of a transmitting side and has a device input terminal 10 which receives a variable bit rate signal transmitted by the coding device at a variable bit rate and comprising a plurality of information bytes. The coding device carries out, for example, an ISO (International Organization for Standardization) MPEG (Motion Picture Experts Group) coding operation as a motion picture coding operation.

The transmission error correction code appending device comprises a correction code appending circuit 11 supplied with an incoming signal 12 comprising first through M-th data groups. Each of the first through the M-th data groups comprises first through N-th data bytes or octets (each of which comprises 8 bits), where M and N represent first and second predetermined plural and natural numbers, respectively. Typically, M and N are 47 and 124, respectively, in the manner which will become clear as the description proceeds. The correction code appending circuit 11 consecutively appends first through M-th error correction codes to the first through the M-th data groups. Each of the first through the M-th error correction codes comprises first through P-th code bytes, where P represents a prescribed natural number. Typically, P is equal to 4. Each error correction code is typically a forward error correction (FEC) code.

The correction code appending circuit 11 consecutively produces first through M-th blocks, each of which comprises the first through the N-th data bytes and the first through the P-th code bytes as first through Q-th block bytes, where Q is equal to (N+P). Typically, Q is equal to 128 (=124+4). As the correction code appending circuit 11, use may be made of an LSI of L64710 which is sold by LSI LOGIC Cooperation.

Connected to the correction code appending circuit 11, an interleaver 13 consecutively receives the first through the Q-th block bytes of the first through the M-th blocks. The interleaver 13 carries out an interleaving operation on the first through the M-th blocks and successively and consecutively produces first through Q-th interleaved data units collectively as an outgoing signal 14. A q-th interleaved data unit of the first through the Q-th interleaved data units comprises a q-th block byte of the first through the Q-th block bytes of each of the first through the M-th blocks, where q consecutively varies from 1 to Q.

The transmission error correcting code appending device further comprises an informing signal producer 15. Connected to the interleaver 13, the informing signal producer 15 produces an informing signal when the interleaver 13 receives the first block byte of the first block.

Connected to the informing signal producer 15, a timer circuit 16 carries out a timing operation of timing a preselected time interval from a time instant at which the timer circuit 16 receives the informing signal. The preselected time interval is equal to a maximum delay in which the interleaver 13 can be permitted to carry out the interleaving operation. The preselected time interval is, for example, 5 milliseconds. The timer circuit 16 produces a time-out signal when the timer circuit 16 times the preselected time interval without receiving a following informing signal which follows the informing signal.

A zero byte generator 17 generates zero bytes, each consisting all zero bits.

A transmitting circuit 18 is connected to the device input terminal 10, the correction code appending circuit 11, the timer circuit 16, and the zero byte generator 17. The transmitting circuit 18 transmits, unless the timer circuit 16 produces the time-out signal, the information bytes to the correction code appending circuit 11 as they are. The transmitting circuit 18 transmits, when the timer circuit 16 produces the time-out signal, the zero bytes to the correction code appending circuit 11 subsequently to the information bytes so that the information bytes and the zero bytes constitute the first through the N-th data bytes of the first through the M-th data groups of the incoming signal 12.

With this structure, it is possible to regulate or assure the maximum delay of the interleaving operation by making use of the preselected time interval of the timer circuit 16.

Figure 2:
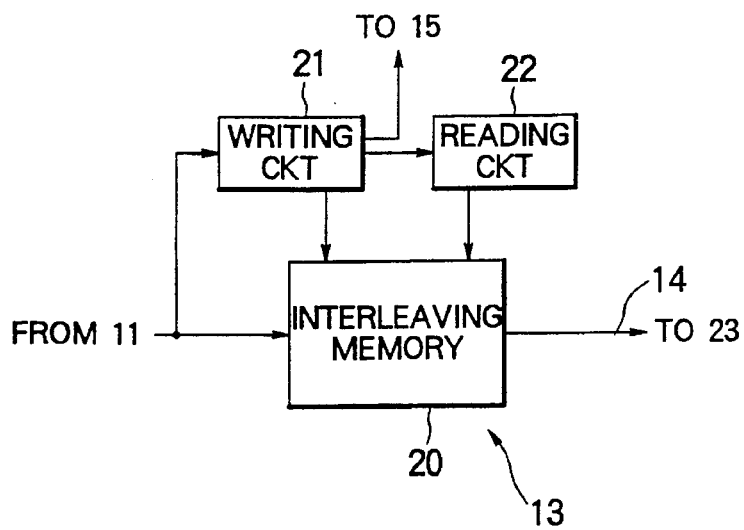
FIG. 2 is a block diagram of an interleaver included in the transmission error correction code appending device illustrated in FIG. 1.

Turning to FIG. 2, the interleaver 13 comprises an interleaving memory 20, a writing circuit 21, and a reading circuit 22.

Figure 3:
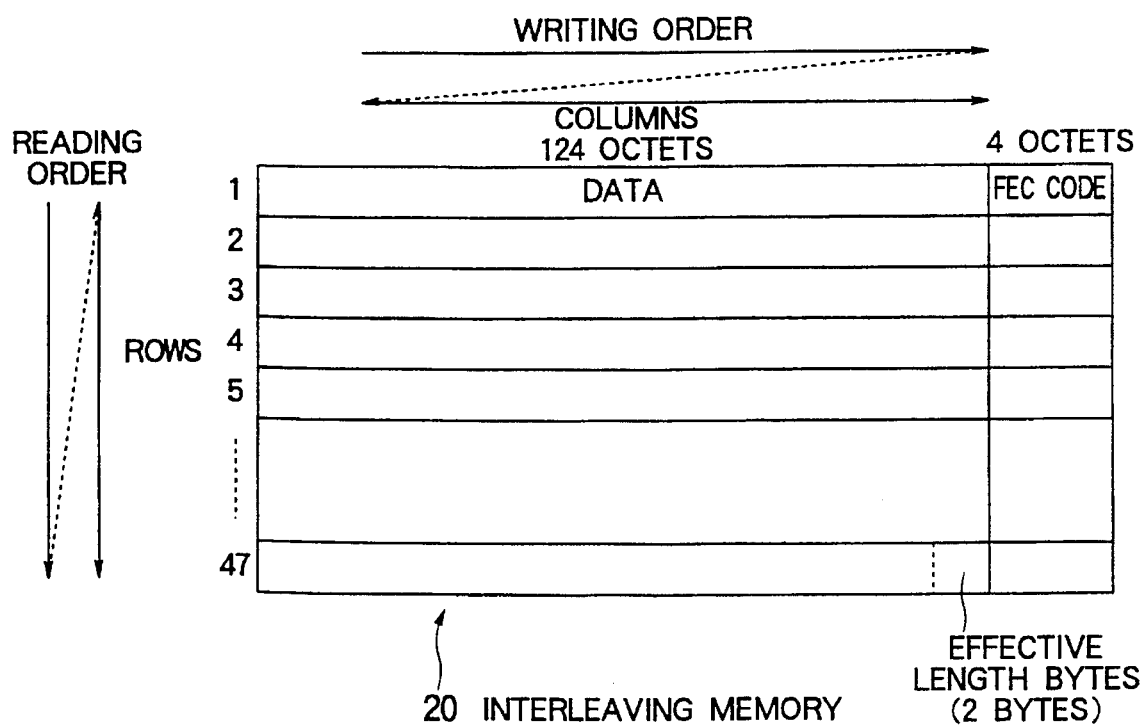
FIG. 3 is a diagram for use in describing operation of an interleaving memory of the interleaver illustrated in FIG. 2.

Turning to FIG. 3 with reference to FIG. 2 continued, the interleaving memory 20 has first through (M×Q)-th memory areas. In the example illustrated in FIG. 3, M is equal to 47 and Q (=N+P) is equal to 128 (=124+4). As each error correction code, use is made of the FEC code using a Reed-Solomon (128, 124) code which is able to correct up to 2 bit errors in each block of 128 bytes in a receiving side and to correct up to 4 ATM cell losses in the receiving side. Connected to the correction code appending circuit 11, the writing circuit 21 carries out a writing operation of consecutively writing the first through the Q-th block bytes of the first through the M-th blocks in the first through the (M×Q)-th memory areas in a writing order illustrated in FIG. 3.

Connected to the interleaving memory 20 and the writing circuit 21, a reading circuit 22 carries out, when the writing circuit 21 finishes the writing operation, a reading operation of successively and consecutively reading, in a reading order illustrated in FIG. 3, the q-th block bytes of the first through the M-th blocks from the first through the (M×Q)-th memory areas collectively as the q-th interleaved data unit (namely, the first through the Q-th interleaved data units which are produced collectively as the outgoing signal 14). The informing signal producing producer 15 is connected to the writing circuit 21 of the interleaver 13 and produces the informing signal when the writing circuit 21 writes the first block byte of the first block in the first memory area of the interleaving memory 20.

In other words, the interleaving memory 20 of FIG. 3 is organized as a matrix of 47 rows and 128 columns. Incoming blocks, each having 128 octet long, are written in the interleaving memory 20 row by row. One block corresponds to one row. Written octets are read out of the interleaving memory 20 column by column as the interleaved data units.

Turning back to FIG. 1, a cell transmitting circuit 23 is connected to the interleaver 13. The cell transmitting circuit 23 successively and consecutively transmits the first through the Q-th interleaved data units of the outgoing signal 14 to a transmission line 24 as first through Q-th ATM (asynchronous transfer mode) cells.

Figure 4:
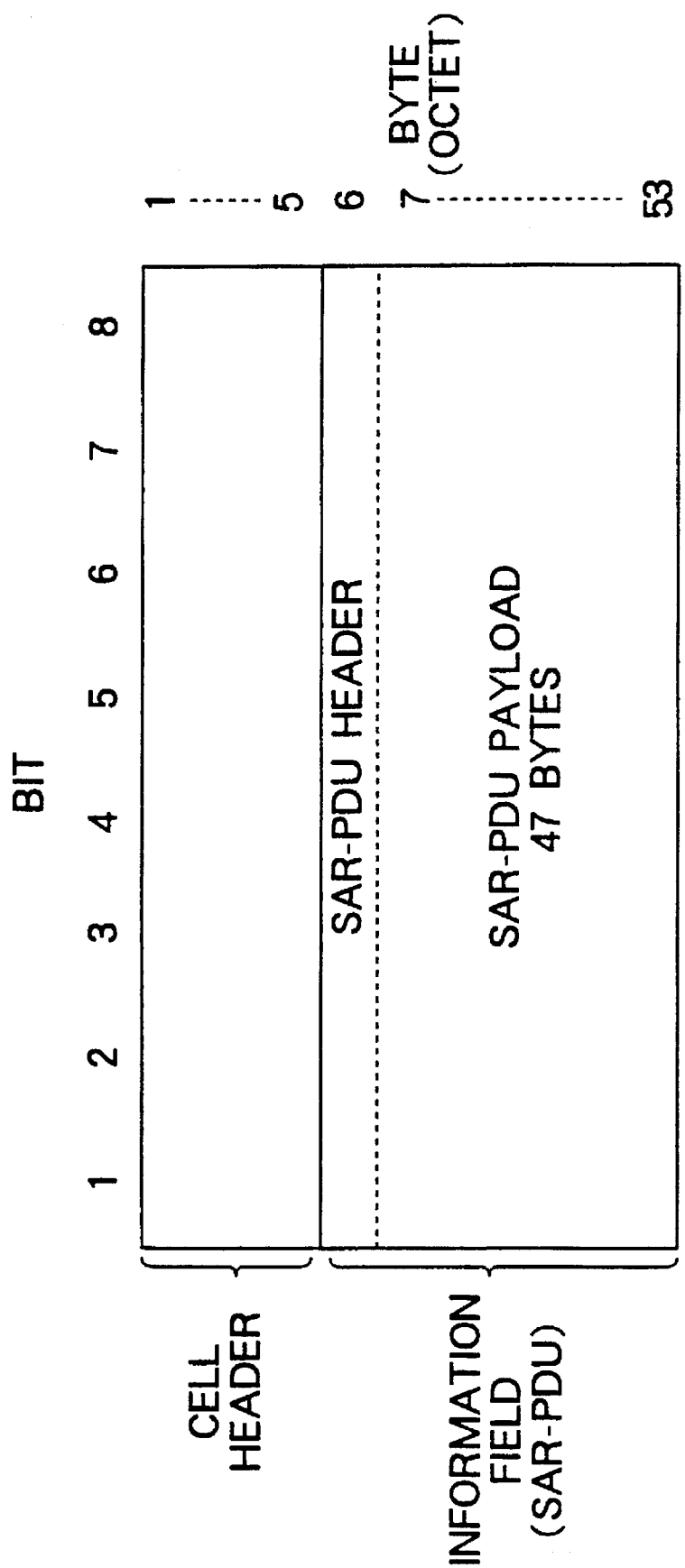
FIG. 4 is a diagram for use in describing a structure of an ATM cell in general.

Turning to FIG. 4, one of the first through the Q-th ATM cells comprises first through 53rd bytes or octets, each consisting of 8 bits. The first through the 5th bytes of the ATM cell in question are collectively called a cell header. The 6th through the 53rd bytes of the ATM cell is called an information field or an SAR-PDU (segmentation and reassembly-protocol data unit). The 6th byte of the ATM cell is named an SAR-PDU header. Remaining 47 bytes (namely, the 7th through the 53rd bytes) of the ATM cell is named an SAR-PDU payload. The cell transmitting circuit 23 (FIG. 1) successively and consecutively transmits the first through the Q-th interleaved data units to the transmission line 24 (FIG. 1) as the SAR-PDU payloads of the first through the Q-th ATM cells.

Figure 5:
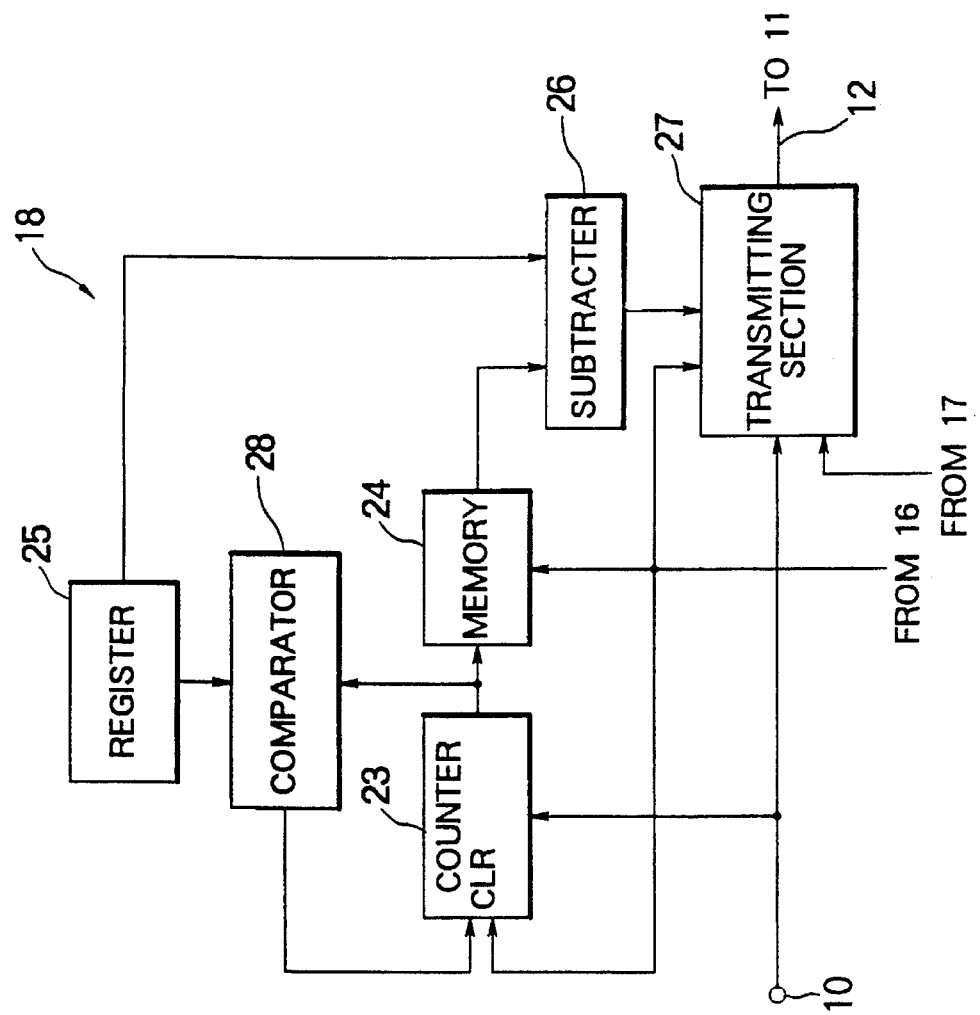
FIG. 5 is a block diagram of a transmitting circuit included in the transmission error correction code appending device illustrated in FIG. 1.

Turning to FIG. 5, the transmitting circuit 18 comprises a counter 23, a memory 24, a register 25, a subtracter 26 and a transmitting section 27. Connected to the device input terminal 10, the counter 23 counts up a count in response to the information bytes from an initial count to an increased count and produces a count signal representative of the increased count. Connected to the timer circuit 16 and the counter 23, the memory 24 memorizes, as a memorized count, the increased count represented by the count signal and produces the memorized count when the timer circuit 16 produces the time-out signal.

The register 25 preliminarily memorizes a preselected value equal to (M×N). Connected to the memory 24 and the register 25, the subtracter 26 produces a subtraction result by subtracting the memorized count of the memory 24 from the preselected value of the register 25.

The transmitting section 27 is connected to the device input terminal 10, the correction code appending circuit 11, the timer circuit 16, the zero byte generator 17, and the subtracter 26. The transmitting section 27 transmits, unless the timer circuit 16 produces the time-out signal, the information bytes to the correction code appending circuit 11 as they are. When the timer circuit 16 produces the time-out signal, the transmitting section 27 transmits the zero bytes, equal in number to the subtraction result of the subtracter 26, to the correction code appending circuit 11 subsequently to the information bytes.

The counter 23 is also connected to the timer circuit 16 to be put into a reset or clear state in response to the time-out signal.

The transmitting circuit 18 further comprises a comparator 28 connected to the counter 23 and the register 25. The comparator 28 compares with the preselected value of the register 25 the increased count represented by the count signal of the counter 22 and produces a coincidence signal when the increased count represented by the count signal coincides with the preselected value of the register 25.

The counter 23 is further connected to the comparator 28 to be put into the reset state in response to the coincidence signal of the comparator 28.

Figure 6:
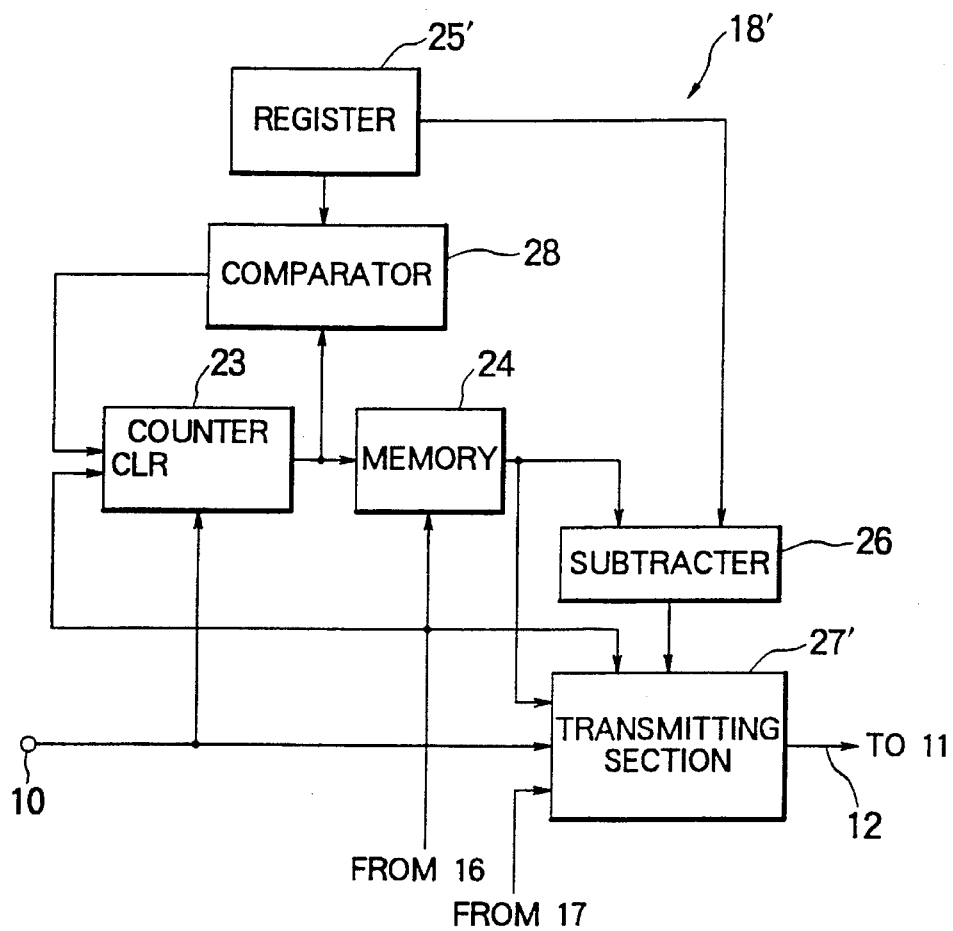
FIG. 6 is a block diagram of another transmitting circuit which may be used instead of the transmitting circuit of the transmission error correction code appending device illustrated in FIG. 1.

Turning to FIG. 6, description will proceed to another transmitting circuit 18' which may be used in the transmission error correction code appending device of FIG. 1 instead of the transmitting circuit 18 of FIG. 5. The transmitting circuit 18' is similar to the transmitting circuit 18 of FIG. 5 except for the following.

That is, another register 25' preliminarily memorizes another preselected value equal to (M×N−R), where R represents a positive integer which is less than the second predetermined plural and natural number N. This number N is, for example, 2 when the numbers M and N are equal to 47 and 124, respectively (that is, when (M×N) is equal to (47×124)). Another transmitting section 27' is connected to the memory 24 in addition to the device input terminal 10, the correction code appending circuit 11, the timer circuit 16, the zero byte generator 17, and the subtracter 26. The transmitting section 27' transmits, unless the timer circuit 16 produces the time-out signal, the information bytes to the correction code appending circuit 11 as they are. When the timer circuit 16 produces the time-out signal, the transmitting section 27' transmits the zero bytes, equal in number to the subtraction result of the subtracter 26, and effective length bytes or octets, equal in number to R, to the correction code appending circuit 11 subsequently to the information bytes with the effective length bytes transmitted subsequently to the zero bytes. The effective length bytes, equal in number to R, represent the memorized count of the memory 24 as an effective length. Inasmuch as a maximum count of the memorized count is 5826 (=47×124−2) when M and N are equal to 47 and 124, the memorized count can be represented by 16 bits of the effective length bytes, equal in number to 2 (=R).

Figure 7:
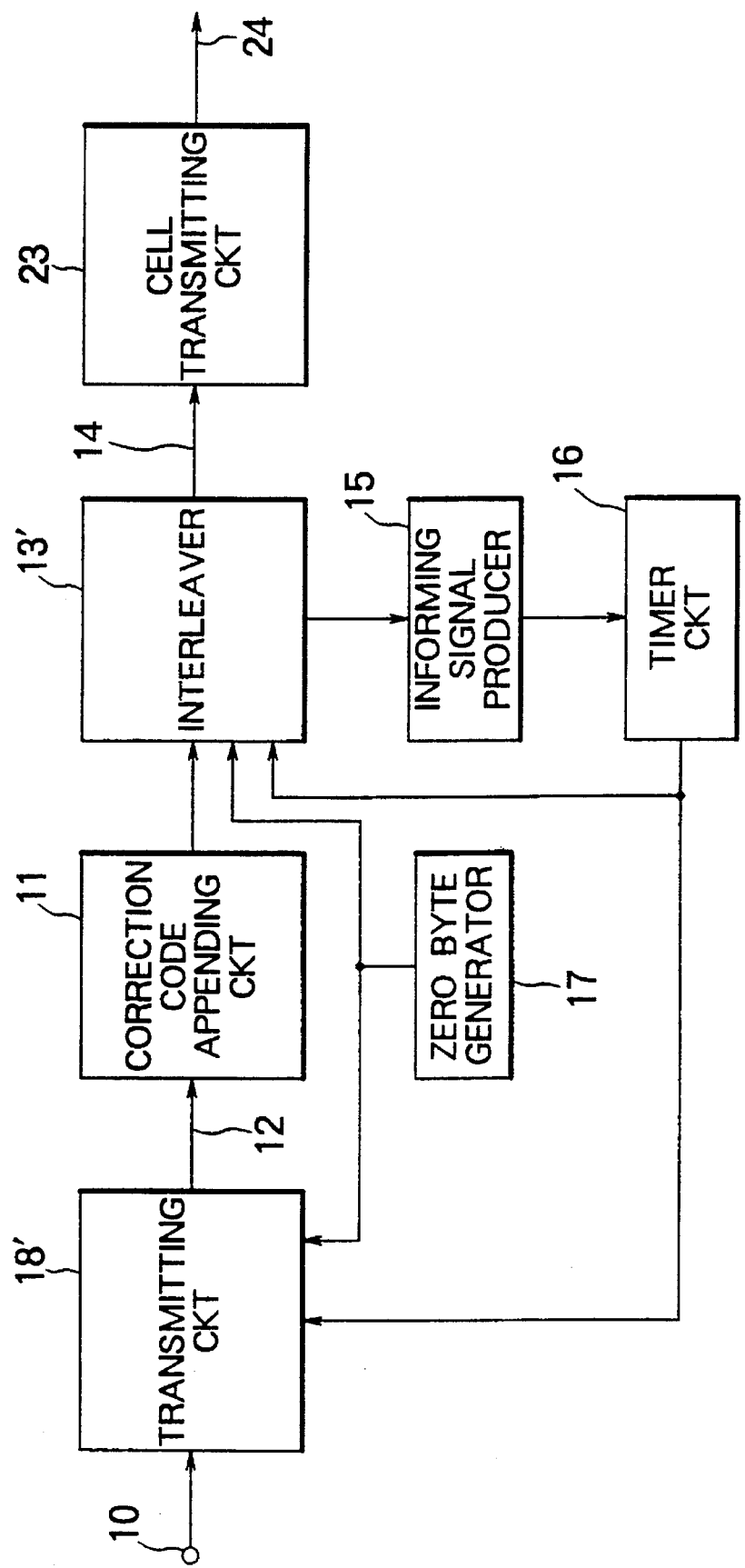
FIG. 7 is a block diagram of a transmission error correction code appending device according to a second embodiment of this invention.

Turning to FIG. 7, a transmission error correction code appending device according to a second embodiment of this invention comprises similar parts designated by like reference numerals. In the transmission error correction code appending device, use is made of the above-mentioned transmitting circuit 18' of FIG. 6. Another interleaver 13' is used instead of the interleaver 13 of the transmission error correction code appending device of FIG. 1.

Figure 8:
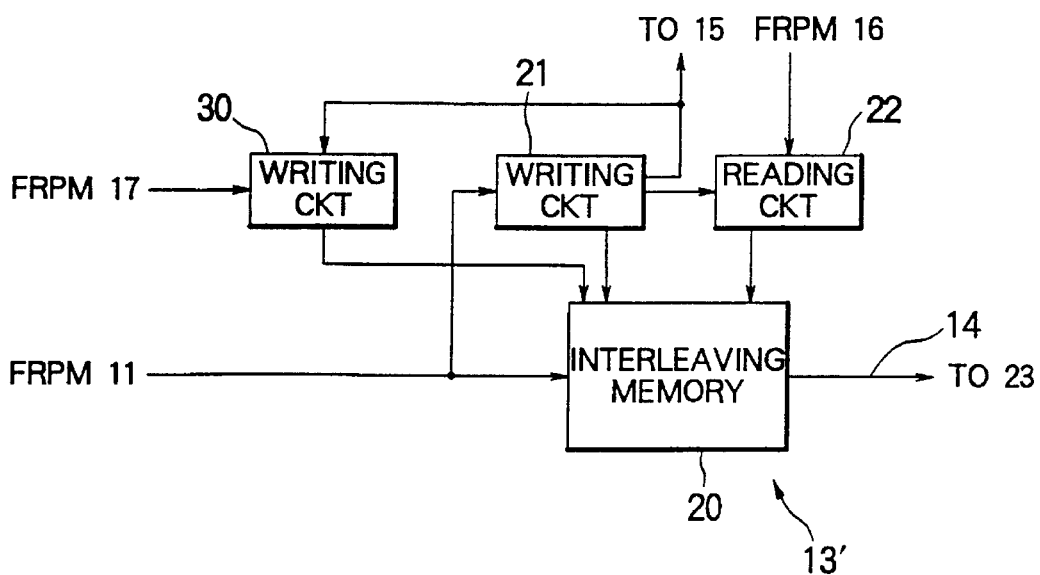
FIG. 8 is a block diagram of another interleaver included in the transmission error correction code appending device illustrated in FIG. 7.

Turning to FIG. 8, the interleaver 13' is similar to the interleaver 13 of FIG. 2 except for the following. That is, the interleaver 13' further comprises another writing circuit 30 connected to the zero byte generator 17 and the writing circuit 21. The writing circuit 30 writes, when the writing circuit 21 writes the first block byte of the first block in the first memory area of the interleaving memory 20, the zero bytes in remaining memory areas among the first through the (M×Q)-th memory areas of the interleaving memory 20.

The reading circuit 22 is also connected to the timer circuit 16 to start the reading operation in response to the time-out signal. In this event, the reading circuit 22 produces, in response to the time-out signal, a q'-th interleaved data unit of the first through the Q-th interleaved data units, where q' consecutively varies from 1 to (Q−P−R). Immediately after the writing circuit 21 writes the effective length bytes, equal in number to R, and the M-th error correction code subsequently to the effective length bytes, the reading circuit produces a q"-th interleaved data unit of the first through the Q-th interleaved data units, where q" consecutively varies from (Q−P−R+1) to Q.

Values Q, P, R, and M are equal to 128, 4, 2, and 47, respectively, in the example illustrated in FIG. 3. In this case, the reading circuit 22 produces, in response to the time-out signal, the q'-th interleaved data unit of the first through the 128-th interleaved data units, where q' consecutively varies from 1 to 122 (=128−4−2). That is, the reading circuit 22 successively and consecutively produces, in response to the time-out signal, the first through the 122nd interleaved data units. Immediately after the writing circuit 21 writes the effective length bytes, equal in number to 2, and the 47th error correction code (namely, the 47th FEC code of 4 octet long) subsequently to the effective length bytes, the reading circuit produces the q"-th interleaved data unit of the first through the 128th interleaved data units, where q" consecutively varies from 123 (=128−4−2+1) to 128. That is, the reading circuit 22 successively and consecutively produces the 123rd through the 128th interleaved data units immediately after the writing circuit 21 writes the effective length bytes, equal in number to 2, and the 47th FEC code of 4 octet long.

Turning to FIG. 9, a transmission error correction code appending device according to a third embodiment of this invention comprises similar parts designated by like reference numerals. The transmission error correction code appending device has a device input terminal 31 for receiving a variable bit rate signal which is transmitted by another coding device at a variable bit rate and comprises a plurality of packets. Each of the packets comprises a variable number of information bytes. The coding device carries out, for example, a variable-length coding operation as the motion picture coding operation and periodically produces the packets at a predetermined packet producing interval or period. The predetermined packet producing interval corresponds to either one frame of a digital video signal or one group of blocks. Alternatively, the predetermined packet producing interval may correspond to one slice of the digital video signal. In an MPEG coding system, one slice corresponds to 16 lines of each frame (480 lines) of the digital video signal. In this case, the predetermined packet producing interval is approximately equal to 1 millisecond.

The transmission error correction code appending device comprises the correction code appending circuit 11 like in the transmission error correction code appending device. The correction code appending circuit 11 is supplied with the incoming signal 12 comprising a first predetermined plural number M of the data groups, each of which is of a second predetermined plural number N of bytes. The correction code appending circuit 11 appends an error correction code of a prescribed natural number P of bytes to each of the data groups and produces the blocks, equal in number to M, each of which is of a third predetermined plural number Q of bytes, where Q is equal to (N+P).

Connected to the correction code appending circuit 11, an interleaver 13" receives the blocks and carries out an interleaving operation on the blocks to successively produce, collectively as the outgoing signal 14, a first preselected number of the interleaved data units, each of which is of a second preselected number of bytes. The first and the second preselected numbers are equal to Q and M, respectively.

Turning to FIG. 10, the interleaver 13" is similar to the interleaver 13 of FIG. 2 except for the following. That is, it is not necessary to connect the writing circuit 21 to the informing signal producer 15 because the informing signal producer 15 is not used in the transmission error correction code appending device illustrated in FIG. 9.

Turning back to FIG. 9, the cell transmitting circuit 23 successively transmits the interleaved data units, equal in number to Q, to the transmission line 24 as the first through the Q-th ATM cells in the manner described above.

The transmission error correction code appending device further comprises a monitoring and transmitting circuit 32 connected to the device input terminal 31, the correction code appending circuit 11, and the zero byte generator 17 and given a preselected natural number which is greater than one and not greater than (M×N). The preselected natural number defines the least number of the information bytes of each of the packets which are periodically produced at the predetermined packet producing interval. In other words, the preselected natural number defines the shortest length of each packet. The monitoring and transmitting circuit 32 monitors the number of the information bytes of each of the packets and transmits, unless the number of the information bytes of each of the packets is less than the preselected natural number, the information bytes of each of the packets to the correction code appending circuit 11 as a part of the bytes of the data groups of the incoming signal 12 as they are. When the number of the information bytes of each of the packets is less than the preselected natural number, the monitoring and transmitting circuit transmits the zero bytes, equal in number to the preselected natural number minus the number of the information bytes of each of the packets, to the correction code appending circuit 11 subsequently to the information bytes of each of the packets as another part of the bytes of the data groups of the incoming signal 12.

With this structure, it is possible to regulate or assure a maximum delay of the interleaving operation of the interleaver 13" by making use of the preselected natural number which is given to the monitoring and transmitting circuit 32 in order to define the least number of the information bytes of each of the packets periodically produced at the predetermined packet producing interval or period.

What is claimed is:

1. A transmission error correction code appending device which has a device input terminal for receiving a variable bit rate signal transmitted at a variable bit rate and comprising a plurality of information bytes, said device including: a correction code appending circuit supplied with an incoming signal comprising first through M-th data groups, each comprising first through N th data bytes, where M and N represent first and second predetermined plural and natural numbers, respectively, said correction code appending circuit consecutively appending to said first through said M-th data groups first through M-th error correction codes, each comprising first through P-th code bytes, where P represents a prescribed natural number, said correction code appending circuit consecutively producing first through M-th blocks, each comprising said first through said N-th data bytes and said first through said P-th code bytes as first through Q-th block bytes, where Q is equal to (N+P); and an interleaver connected to said correction code appending circuit for consecutively receiving the first through the Q-th block bytes of said first through said M-th blocks and for carrying out an interleaving operation on said first through said M-th blocks to successively and consecutively produce first through Q-th interleaved data units, a q-th interleaved data unit of said first through said Q-th interleaved data units comprising a q-th block byte of said first through said Q-th block bytes of each of said first through said M-th blocks, where q consecutively varies from 1 to Q; wherein said transmission error correction code appending device comprises:

informing signal producing means connected to said interleaver for producing an informing signal when said interleaver receives the first block byte of said first block;

a timer circuit connected to said informing signal producing means for timing a preselected time interval beginning from the time said timer circuit receives said informing signal, said timer circuit producing a time-out signal when said timer circuit times said preselected time interval without receiving a following informing signal which follows said informing signal;

a zero byte generator for generating zero bytes, each consisting all zero bits; and a transmitting circuit connected to said device input terminal, said correction code appending circuit, said timer circuit, and said zero byte generator for transmitting, unless said timer circuit produces said time-out signal, said information bytes to said correction code appending circuit as they are and for transmitting, when said timer circuit produces said time-out signal, said zero bytes to said correction code appending circuit subsequently to said information bytes so that said information bytes and said zero bytes constitute the first through the N-th data bytes of said first through said M-th data groups of said incoming signal.

2. A transmission error correction code appending device as claimed in claim 1, further comprising a cell transmitting circuit connected to said interleaver for successively and consecutively transmitting said first through said Q-th interleaved data units to a transmission line as first through Q-th ATM cells.

3. A transmission error correction code appending device as claimed in claim 1, said interleaver including: an interleaving memory having first through (M×Q)-th memory areas: a writing circuit connected to said correction code appending and said interleaving memory for carrying out a writing operation of consecutively writing the first through the Q-th block bytes of said first through said M-th blocks in said first through said (M×Q)-th memory areas; and a reading circuit connected to said interleaving memory and said writing circuit for carrying out, when said writing circuit finishes said writing operation, a reading operation of successively and consecutively reading the q-th block bytes of said first through said M-th blocks from said first through said (M×Q)-th memory areas collectively as the q-th interleaved q-th interleaved data unit of said first through said Q-th interleaved data units, wherein:

said informing signal producing means is connected to said writing circuit to produce said informing signal when said writing circuit writes said first block byte of said first block in said first memory area.

4. A transmission error correction code appending device as claimed in claim 3, wherein said transmitting circuit comprises:

counting means connected to said device input terminal for counting up a count in response to said information bytes from an initial count to an increased count to produce a count signal representative of said increased count;

memory means connected to said timer circuit and said counting means for memorizing, as a memorized count, the increased count represented by said count signal to produce said memorized count when said timer circuit produces said time-out signal;

register means for memorizing a preselected value equal to (M×N);

subtracter means connected to said memory means and said register means for producing a subtraction result by subtracting said memorizing count from said preselected value; and transmitting means connected to said device input terminal, said correction code appending circuit, said timer circuit, said zero byte generator, and said subtracter means, said transmitting means for transmitting, unless said timer circuit produces said time-out signal, said information bytes to said correction code appending circuit, and when said timer circuit produces said time-out signal, for transmitting said zero bytes to said correction code appending circuit subsequently to said information bytes, and said zero bytes transmitted being equal in number to said subtraction result.

5. A transmission error correction code appending device as claimed in claim 4, wherein said counting means is also connected to said timer circuit and adapted to be reset in response to said time-out signal.

6. A transmission error correction code appending device as claimed in claim 4, wherein:

said transmitting circuit further comprises comparator means connected to said counter means and said register means, said comparator means comparing said preselected value of said register means with said increased count represented by said count signal of said counter means and produces a coincidence signal when said increased count coincides with said preselected value;

said counting means being also connected to said comparator means to be put into a reset state in response to said coincidence signal.

7. A transmission error correction code appending device as claimed in claim 3, wherein said transmitting circuit comprises:

counting means connected to said device input terminal for counting up a count in response to said information bytes from an initial count to an increased count to produce a count signal representative of said increased count;

memory means connected to said timer circuit and said counting means for memorizing, as a memorized count, the increased count represented by said count signal to produce said memorized count when said timer circuit produces said time-out signal;

register means for memorizing a preselected value equal to (M×N−R), where R represents a positive integer which is less than said second predetermined plural and natural number N;

subtracter means connected to said memory means and said register means for producing a subtraction result by subtracting said memorizing count from said preselected value; and transmitting means connected to said device input terminal, said correction code appending circuit, said timer circuit, said zero byte generator, said memory means, and said subtracter means, said transmitting means for transmitting, unless said timer means produces said time-out signal, said information bytes to said correction code appending circuit, and when said timer circuit produces said time-out signal, said transmitting means transmitting zero bytes to said correction code appending circuit subsequently to said information bytes with said effective length bytes transmitted subsequently to said zero bytes, said effective length bytes representing said memorized count as an effective length, and said zero bytes transmitted being equal in number to said subtraction result and said effective length bytes being equal in number to R.

8. A transmission error correction code appending device as claimed in claim 7, wherein said counting means is also connected to said timer circuit and adapted to be reset in response to said time-out signal.

9. A transmission error correction code appending device as claimed in claim 7, wherein:

said transmitting circuit further comprises comparator means connected to said counter means and said register means, said comparator means comparing said preselected value of said register means with said increased count represented by said count signal of said counter means and produces a coincidence signal when said increased count coincides with said preselected value;

said counting means being also connected to said comparator means to be put into a reset state in response to said coincidence signal.

10. A transmission error correction code appending device as claimed in claim 7, wherein:

said interleaver further comprises writing means connected to said zero byte generator and said writing circuit, said writing means for writing said zero bytes in remaining memory areas among said first through said (M×Q)-th memory areas of said interleaver when said writing circuit writes the first block byte of said first block in said first memory area;

said reading circuit being also connected to said timer circuit to start said reading operation in response to said time-out signal.

11. A transmission error correction code appending device as claimed in claim 10, wherein said reading circuit produces, in response to said time-out signal, a q'-th interleaved data unit of said first through said Q-th interleaved data units, where q' consecutively varies from 1 to (Q−P−R), and said reading circuit produces a q"-th interleaved data unit of said first through said Q-th interleaved data units immediately after said writing circuit writes said effective length bytes equal in number to R, and writes said M-th error correction code subsequently to said effective length bytes, where q" consecutively varies from (Q−P−R+1) to Q.

12. A transmission error correction code appending device which has a device input terminal for receiving a variable bit rate signal transmitted at a variable bit rate and comprising a plurality of packets, each comprising a variable number of information bytes, said device including: a correction code appending circuit supplied with an incoming signal comprising a first predetermined plural number M of data groups, each of which is of a second predetermined plural number N of bytes, said correction code appending circuit appending to each of said data groups an error correction code of a prescribed natural number P of bytes to produce blocks, equal in number to M, each of which is of a third predetermined plural number Q of bytes, where Q is equal to (N+P); and an interleaver connected to said correction code appending circuit for receiving said blocks and for carrying out an interleaving operation on said blocks to successively produce a first preselected number of interleaved data units, each of which is of a second preselected number of bytes, said first and said second preselected numbers being equal to Q and M, respectively, wherein said transmission error correction code appending device comprises:

a zero byte generator for generating zero bytes, each being of all zero bits; and a monitoring and transmitting circuit connected to said device input terminal, said correction code appending circuit, and said zero byte generator and given a preselected natural number grater than one and not greater than (M×N) for monitoring the number of said information bytes of each of said packets and for transmitting, unless the number of said information bytes of each of said packets is less than said preselected natural number, said information bytes of each of said packets to said correction code appending circuit as a part of the bytes of said data groups of said incoming signal, and when the number of said information bytes of each of said packets is less than said preselected natural number, said monitoring and transmitting circuit transmitting said zero bytes to said correction code appending circuit subsequently to said information bytes of each of said packets as part of said data groups of said incoming signal, said zero bytes transmitted being equal in number to said preselected natural number minus the number of said information bytes of each of said packets.

13. A transmission error correction code appending device as claimed in claim 12, further comprising a cell transmitting circuit connected to said interleaver for successively and consecutively transmitting said first through said Q-th interleaved data units to a transmission line as first through Q-th ATM cells.

* * * * *